United States Patent
Leigh et al.

(10) Patent No.: US 7,623,356 B2
(45) Date of Patent: Nov. 24, 2009

(54) SYSTEM AND METHOD TO CONJOIN BLADE MODULES

(75) Inventors: Kevin B. Leigh, Houston, TX (US); Thomas T. Hardt, Missouri City, TX (US); Timothy A. McCree, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/789,601

(22) Filed: Apr. 25, 2007

(65) Prior Publication Data

US 2008/0266815 A1    Oct. 30, 2008

(51) Int. Cl.
    *H01R 12/16* (2006.01)
(52) U.S. Cl. .................. 361/788; 361/686; 361/727; 361/730
(58) Field of Classification Search .......... 361/807, 361/685, 686, 707, 727, 730, 788, 801
    See application file for complete search history.

(56) References Cited

U.S. PATENT DOCUMENTS

| | | | | |
|---|---|---|---|---|
| 4,424,559 A * | 1/1984 | Lorincz et al. ................. 700/2 |
| 4,812,643 A * | 3/1989 | Talbot .................... 250/222.1 |
| 5,293,400 A * | 3/1994 | Monod et al. ................ 375/219 |
| 5,379,184 A * | 1/1995 | Barraza et al. .............. 361/685 |
| 5,426,564 A * | 6/1995 | Hsu .......................... 361/707 |
| 5,483,419 A * | 1/1996 | Kaczeus et al. ............. 361/685 |
| 5,483,649 A * | 1/1996 | Kuznetsov et al. ............ 726/22 |
| 5,657,470 A * | 8/1997 | Fisherman et al. .......... 711/153 |
| 5,724,227 A * | 3/1998 | Hancock et al. ............. 361/685 |
| 5,941,038 A * | 8/1999 | Bristow et al. ............. 52/506.1 |
| 6,115,245 A * | 9/2000 | Ruch et al. .................. 361/685 |
| 6,250,035 B1 * | 6/2001 | Bristow et al. ............. 52/506.1 |
| 6,351,786 B2 * | 2/2002 | Elmore et al. ............... 710/303 |
| 6,490,157 B2 * | 12/2002 | Unrein ....................... 361/687 |
| 6,529,473 B1 * | 3/2003 | Bavant et al. ............... 370/217 |
| 6,646,893 B1 | 11/2003 | Hardt |
| 6,735,450 B1 * | 5/2004 | Remmert .................. 455/550.1 |
| 6,776,296 B2 * | 8/2004 | Herren ......................... 211/66 |
| 6,935,868 B1 * | 8/2005 | Campini et al. ............... 439/67 |
| 7,054,163 B2 * | 5/2006 | Coffey ........................ 361/796 |
| 7,072,186 B2 | 7/2006 | Hardt |
| 7,092,258 B2 | 8/2006 | Hardt |
| 7,101,188 B1 * | 9/2006 | Summers et al. .............. 439/59 |
| 7,172,432 B2 * | 2/2007 | Campini et al. ............... 439/74 |
| 7,185,221 B1 * | 2/2007 | Kamel ........................... 714/4 |
| 7,243,608 B2 * | 7/2007 | Knight et al. ................ 114/267 |
| 7,255,578 B2 * | 8/2007 | Campini et al. ............... 439/79 |
| 7,292,457 B2 * | 11/2007 | DeNies et al. ............... 361/801 |
| 7,298,614 B2 * | 11/2007 | Halliday et al. ............. 361/686 |
| 7,304,940 B2 * | 12/2007 | Larsen et al. ................ 370/218 |
| 7,345,890 B2 * | 3/2008 | DeNies et al. ............... 361/801 |
| 2002/0001175 A1 * | 1/2002 | Unrein ....................... 361/687 |
| 2003/0182328 A1 * | 9/2003 | Paquette et al. ............. 707/204 |

(Continued)

*Primary Examiner*—Dean A. Reichard
*Assistant Examiner*—Xiaoliang Chen

(57) ABSTRACT

Embodiments of the present technique are directed to a blade system. The blade system may include a first blade module comprising a first conjoining channel, and a second blade module comprising a second conjoining channel aligned with the first conjoining channel, wherein the first blade module and the second blade module are symmetrical and mechanically coupled to form a conjoined blade, wherein electrical components of the first blade module and electrical components of the second blade module are electrically coupled via an electrical coupler routed through the aligned first conjoining channel and second conjoining channel.

23 Claims, 6 Drawing Sheets

U.S. PATENT DOCUMENTS

| | | |
|---|---|---|
| 2005/0059899 A1* | 3/2005 | Merilainen et al. .......... 600/544 |
| 2006/0262734 A1* | 11/2006 | Appanna et al. ............ 370/254 |
| 2007/0002761 A1* | 1/2007 | Diamant et al. ............. 370/252 |
| 2007/0121306 A1* | 5/2007 | Moakes et al. .............. 361/788 |
| 2007/0124529 A1* | 5/2007 | Carr et al. ................... 710/317 |
| 2008/0037218 A1* | 2/2008 | Sharma et al. .............. 361/695 |
| 2008/0123854 A1* | 5/2008 | Peel et al. ................... 380/277 |

* cited by examiner

SYSTEM AND METHOD TO CONJOIN BLADE MODULES

BACKGROUND

This section is intended to introduce the reader to various aspects of art which may be related to various aspects of the present invention that are described and/or claimed below. The discussion is believed to be helpful in providing the reader with background information to facilitate a better understanding of the various aspects of the present subject matter. Accordingly, it should be understood that these statements are to be read in this light, and not as admissions of prior art.

Computer servers are used by a wide array of users in various configurations. Server systems often comprise multiple servers and/or server blades housed in a chassis and/or a standard rack mount. To house blade servers, a server system may comprise a chassis including multiple blade bays, with each blade bay configured to house a single full height server blade. The server blades may include processing blade modules, input/output (IO) blade modules, and the like. In a system with multiple blade modules, the modules may be electrically coupled to facilitate the exchange of data between the modules. For example, a processing blade module may exchange information with an IO module or another processing module in an adjacent server bay via a backplane in the system. As server blades have become more compact, more blade modules may be located in a single system. Thus, as the number of blade modules increase, the complexity and cost of a server system may increase significantly due to the increased number of processors, controllers and other components required to interface between the server blade modules in the system. For example, replicating IO modules to expand IO capability for a server blade may be cost prohibitive when an IO module includes a controller and multiple peripheral devices such as disk drives.

DETAILED DESCRIPTION OF SPECIFIC EMBODIMENTS

One or more exemplary embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As discussed in greater detail below, one or more embodiments of the present technique provides a novel system to conjoin multiple blade modules, such as server blade modules. A blade module that includes an enclosure configured to provide for electrical and mechanical coupling to a complementary/symmetrical blade module is disclosed. In one embodiment, two conjoined symmetrical processing blade modules are electrically coupled via a cable routed through a channel in the enclosures of each module and mechanically coupled via a conjoining device. In another embodiment, two symmetrical IO blade modules are similarly conjoined. The conjoined blades may operate as a single blade module or independent blade modules. Further, the system may enable a single blade module to support devices in both conjoined blades and, thus, provide a redundant blade configuration that is more robust. Embodiments described below generally refer to conjoined blades one above the other in a vertical orientation; however, the disclosed blade modules may be used in other chassis configurations, such as a configuration where the blades are horizontally oriented. Upon reading the following description, it will be apparent that the disclosed techniques may be generally used to conjoin other forms of blade modules.

Figure 1:
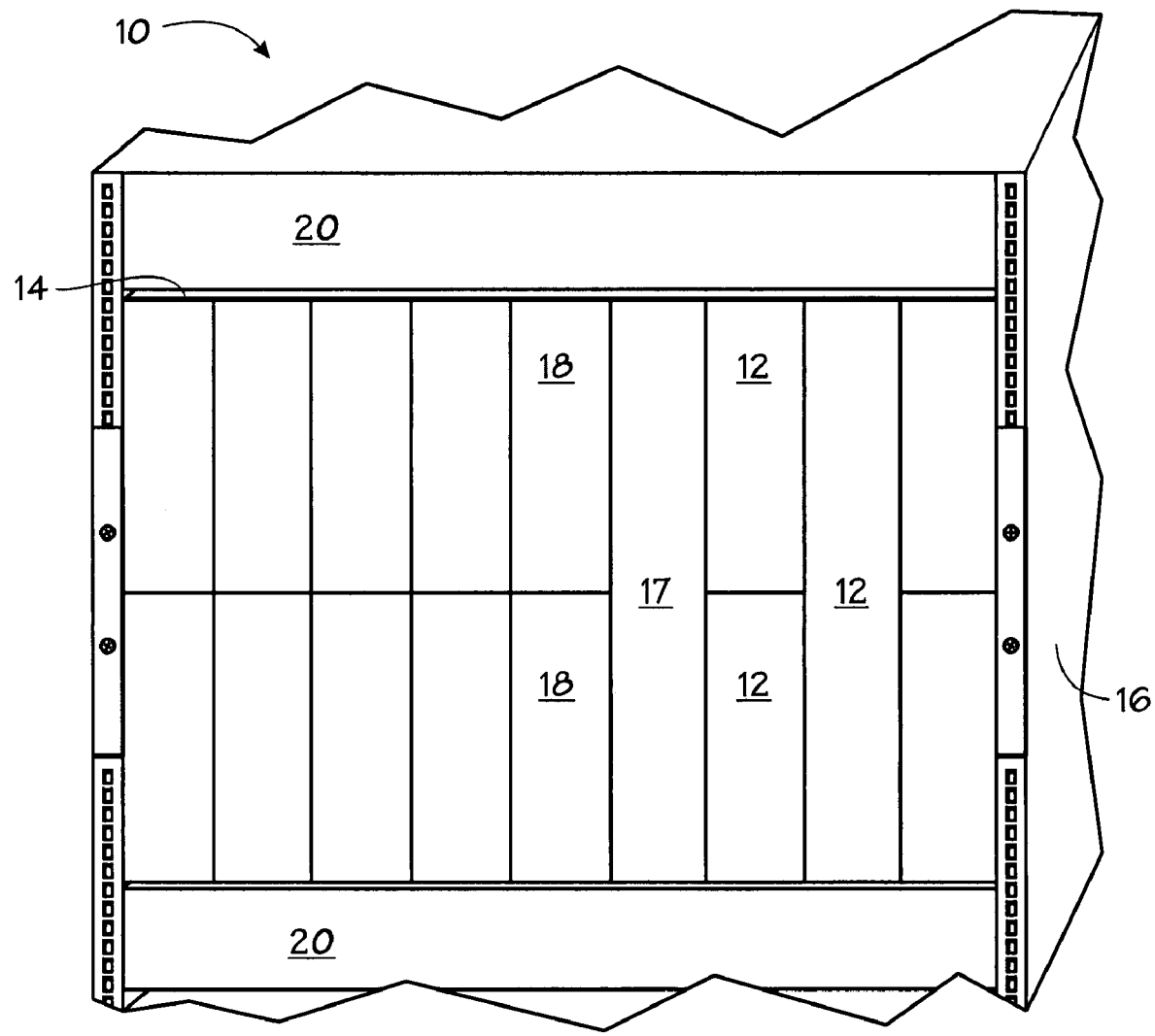
FIG. 1 is a perspective view illustrating a rack mounted enclosure system having a plurality of modular blades in accordance with one embodiment of the present technique.

Turing now to the figures, an exemplary rack mount enclosure system 10 is illustrated in FIG. 1 in accordance with one embodiment of the present technique. In the illustrated embodiment, the rack mount enclosure system 10 includes a number of server blades 12 disposed within a chassis or enclosure 14. The chassis 14 is disposed in a rack structure or housing 16 and mounted thereto via mounting brackets. As discussed in greater detail below, the server blades 12 are modular, in that additional components may be externally mounted to the server blades 12 to convert or upgrade the server blades 12. The server blades may be provided as "full height" server blades 17 configured to span the height of a single bay, or "half height" server blades 18 that are half the height of the blade bay. Thus, two half height serve blades 18 may be stacked into a single blade bay. Additionally, other components 20 may also be disposed in the rack structure 16 in accordance with the present technique. As will be appreciated, other components 20 may include cooling fans, power supplies, operator interfaces, and the like. It should also be noted that the rack structure 16 may have any number and configuration of rack mount receptacles having supports, such as manual or automatic rail mechanisms that support the server blades 12, the chassis 14, or various other components 20.

The server blades 12 may include a number of configurations to provide various functions in the system 10. Internally, each server blade 12 may include one or more structures, including a printed circuit assembly (PCA) including a printed circuit board (PCB), hard disk drives, volatile or non-volatile memory devices, processors and controllers, for instance. Thus, each server blade 12 may provide the system 10 with one or more functions such as networking, various interconnects and data management, for example. To provide processing on the system a processing blade module 22, as described and illustrated with respect to FIG. 2, may include a processor configured to transmit and process data on the server system 10. Further, an IO blade module 24, as described and illustrated with respect to FIG. 3, may include storage in the form of hard disk drives controlled by a storage controller.

As the complexity of rack mount systems 10 increases, various issues may arise. For example, expanding IO capabilities for the server blades 12 traditionally requires a dedicated IO blade module 24. Replicating IO blade modules 24 to expand IO capability of the server blade 12 can be cost prohibitive when an IO blade module 24 includes a controller and multiple peripheral devices, such as disk drives. Further, a system 10 comprising multiple controllers and processors may increase the complexity of the system 10 as each processor and controller may need individual management. To address these concerns, multiple server blades 12 may be conjoined to enable simplified expansion of processing and IO capabilities and provide robust operation.

Figure 2:
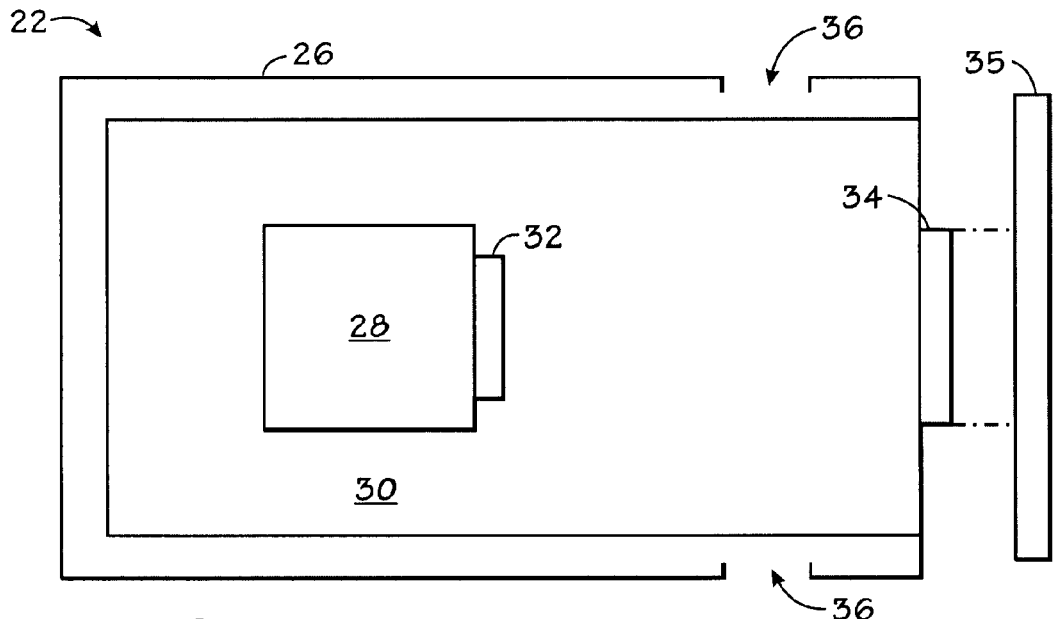
FIG. 2 is an illustration of an exemplary processing blade module in accordance with aspects of the present technique.

Turing now to FIG. 2, an exemplary embodiment of a processing blade module 22 in accordance with aspects of the present technique is illustrated. The processing blade module 22 comprises an enclosure 26 configured to house a processing device 28. In one embodiment, the processing device 28 may include a processor configured to receive and transmit data signals and carry out task specific processing functions. As depicted, the processing device 28 may be coupled to a printed circuit board (PCB) 30 contained within the enclosure 26. The processing blade module 22 may also include connectors 32 configured to enable connectivity, such as a cable, to the processing device 28. As depicted, the connector 32 may be disposed on the PCB 30 proximate to the processing device 28. For example, the connectors 32 may be coupled to the PCB and coupled to the processing device via electrical traces or other electrical routing mechanisms. In another embodiment, the connector 32 may be disposed on the processing device 28. Further, the processing blade module 22 may include a backplane connector 34. The backplane connector 34 enables connection to other components 20 of the server system 10. For example, the backplane connector 34 may electrically couple the processing device 28 to other server blades 12 via a backplane 35 or cabling that interconnects the servers 12.

As depicted in FIG. 2, the enclosure includes multiple channels 36. The channels 36 are openings in the enclosure 26 that are configured to enable an electrical coupler, such as cable 38, to be routed from within the enclosure 26 to a location external to the enclosure 26 as described and illustrated with respect to FIG. 4. For example, a cable 38 may be connected to the processing device 28 and routed out of the enclosure 26 via the channel 36. Multiple channels 36 may be formed through the enclosure 26 to enable flexibility in positioning the processing blade module 22, as discussed in greater detail below. For example, in the illustrated embodiment, the enclosure 26 includes two channels 36.

Figure 3:
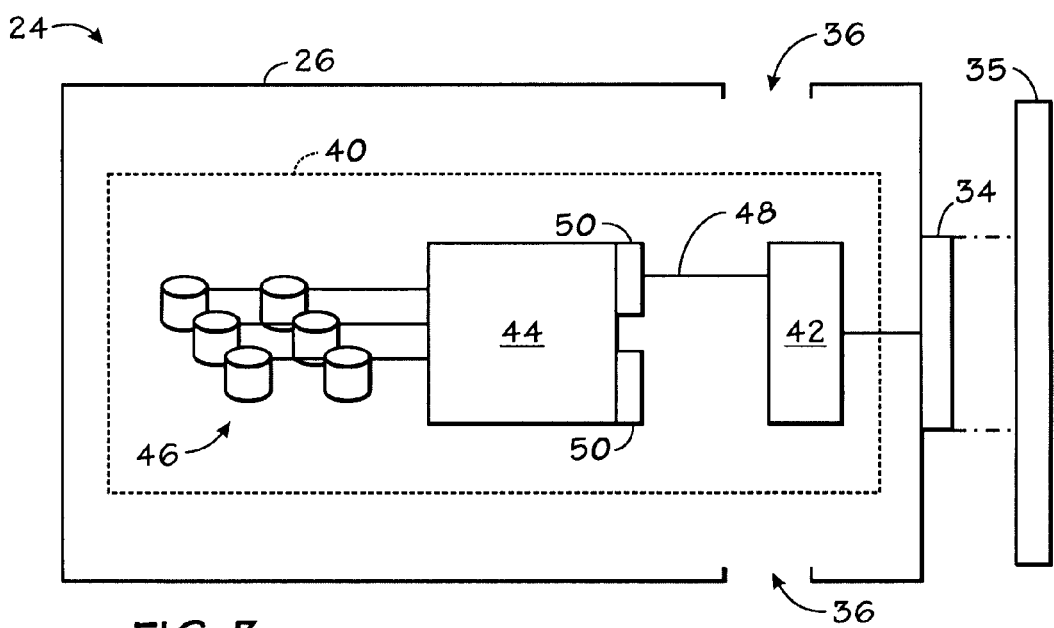
FIG. 3 is an illustration of an exemplary IO blade module in accordance with aspects of the present technique.

Similar to FIG. 2, an exemplary embodiment of an IO blade module 24 is depicted in FIG. 3. The embodiment of the IO blade module 24 comprises IO devices 40 housed within an enclosure 26. As depicted, the IO devices 40 may comprise components for storage, including a disk controller 42, IO expander 44 and disk drives 46. Further, the IO blade module 24 may include a backplane connector 34. The backplane connector 34 may enable connection of the IO blade module 24 to other components 20 of the server system 10. For example, the backplane connector 34 may electrically couple the IO devices 40 to other server blades 12 via the backplane 35 or cabling that interconnects the servers 12.

In an IO blade module 24 configured for storage, the disk controller 42 may provide an interface to the IO expander 44 and the disk drives 46. For example, in one embodiment, the disk controller 42 may comprise a RAID controller to manage the physical storage units on the disk drives 46 and provide them to other components of the system (such as a processing device 28) as logical units. The disk controller 42 may be integrated with the IO expander 44 and disk drives 46, or the disk controller 42 may be provided separate from the other IO devices 40. As described and illustrated with respect to FIG. 5, an alternate control of the IO expander 44 and the disk drives 46 may be provided via the additional connector 50. For example, a cable or bridge PCB may be routed from an additional controller to the connector 50 via channel 36.

As previously described, the disk controller 42 may interface with the IO expander 44. In one embodiment, the IO expander 44 includes a Serial Attached SCSI (SAS) expander configured to enable communication between several SAS devices, such as disk drives 46. For example, as depicted, the IO expander 44 facilitates communication between the disk controller 42 and multiple disk drives 46. The IO expander 44 may be electrically coupled to the disk controller 42 to enable communication between the two. For example, as depicted, the IO expander 44 is electrically coupled to the disk controller 42 via a trace or a cable 48 routed from the disk controller 42 to an expander connector 50 located proximate to the expander 44.

As depicted in FIG. 3, the enclosure includes two channels 36 similar to those in FIG. 2. The channels 36 may be located at the top and bottom of the enclosure 26. As will be appreciated, multiple channels 36 may be located in the enclosure 26 to enable flexibility in positioning the IO blade module 22, as discussed in greater detail below.

Figure 4:
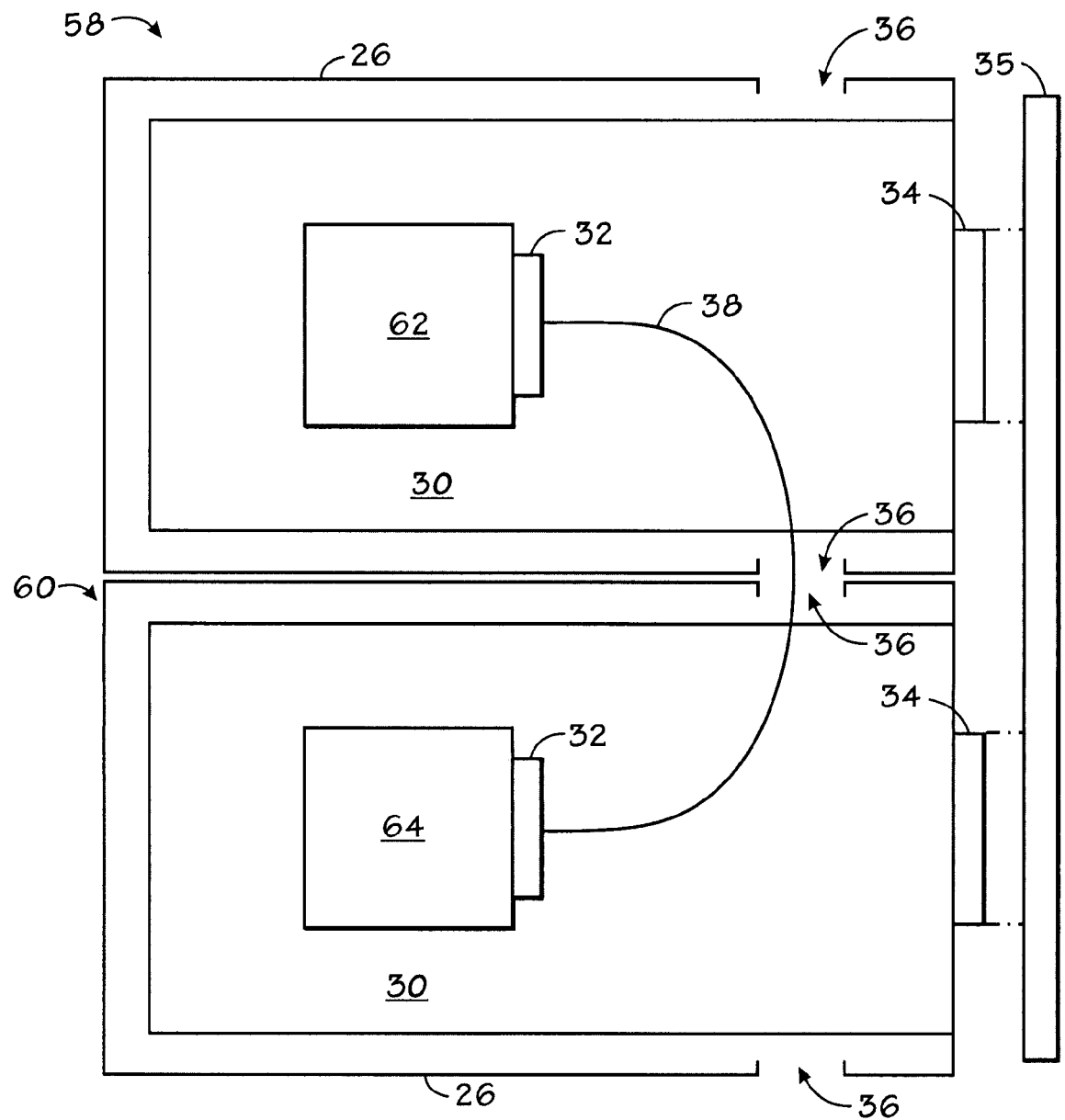
FIG. 4 is an illustration of the exemplary processing blades of FIG. 2 conjoined in accordance with aspects of the present technique.

Turning now to FIG. 4, two conjoined processing blade modules 58 and 60 are illustrated. In one embodiment two half height processing blade modules 58 and 60 are mechanically coupled such that one is positioned above the other and the channels 36 of the two modules 58 and 60 are aligned. For example, as depicted, a first processing blade module 58 may be positioned above a second processing blade module 60. It is noted that "above" refers to positioning of the system 10 in a vertical configuration, however, the orientation may be varied. For example, the system 10 may be oriented such that the modules 58 and 60 are located horizontally and to the side of one another. The lower channel 36 on the first processing blade module 58 is aligned with the upper channel 36 of the second processing blade module 60. The aligned channels 36 enable routing of a cable 38, between the processing devices 28 of each respective processing blade module 58 and 60. It should be noted that the cable 38 and other cables discussed in this paper may include a bridge PCB or other device configured to coupled devices within the system. Accordingly, the cable 38 may be directly coupled to each processing device 28 or may be coupled to connectors 32 which are electrically coupled to a first processing device 62 and a second processing device 64. For example, as depicted, the cable 38 may run from the connector 32 in the first processing blade module 58 to the connector 32 located in the second blade module 60. Further, the modules 58 and 60 may be connected via the backplane connectors 34 to the backplane 35.

It should be noted that the embodiment of FIG. 4 enables the position of the processing blade modules 22 to be varied. For example, in one embodiment, the first processing blade module 58 may be located below the second processing blade module 60. This is facilitated by the symmetrical design of the two processing blade modules 58 and 60. As used herein, "symmetrical" refers to modules with the same or similar components and physical design and which may be swapped in and out. The processing blade modules 58 and 60 contain similar components (such as a processing device 62 and 64) and similar enclosures 26 that contain multiple channels 36 located on both sides of the enclosure. The channels enable a cable 38 to be routed through the top or bottom of each enclosure 26, depending on the configuration of the processing blade modules 58 and 60. Thus, the processing blade modules 58 and 60 are symmetrical and may be exchanged in position without altering the overall functionality of the system 10.

The configuration depicted in FIG. 4 provides for a more robust system 10. For example, the first processing device 62 may function independently or in coordination with the second processing device 64. In an "active/active" embodiment the processing devices 62 and 64 operate independently of each other. Thus, each processing device 62 and 64 may simultaneously complete processing functions. Further, the each processing device 62 and 64 may work in cooperation to provide a single system that provides processing by both processing devices 62 and 64. In an "active/passive" embodiment, the first processing device 62 may remain active while the second processing device 64 remains passive and monitors the status of the first processing device 62. Upon failure of the first processing device 62, the second processing device 64 may take-over the processing duties. For example, as depicted in FIG. 4, the first processing device 62 may remain in an active processing state while the second processing device 64 remains in a passive mode. Upon failure of the first processing device 62, the second processing device 64 may shift into an active state to provide the desired processing. It should be noted that either of the two processing devices 62 and 64 may be used as the active/passive processing device 28.

Figure 5:
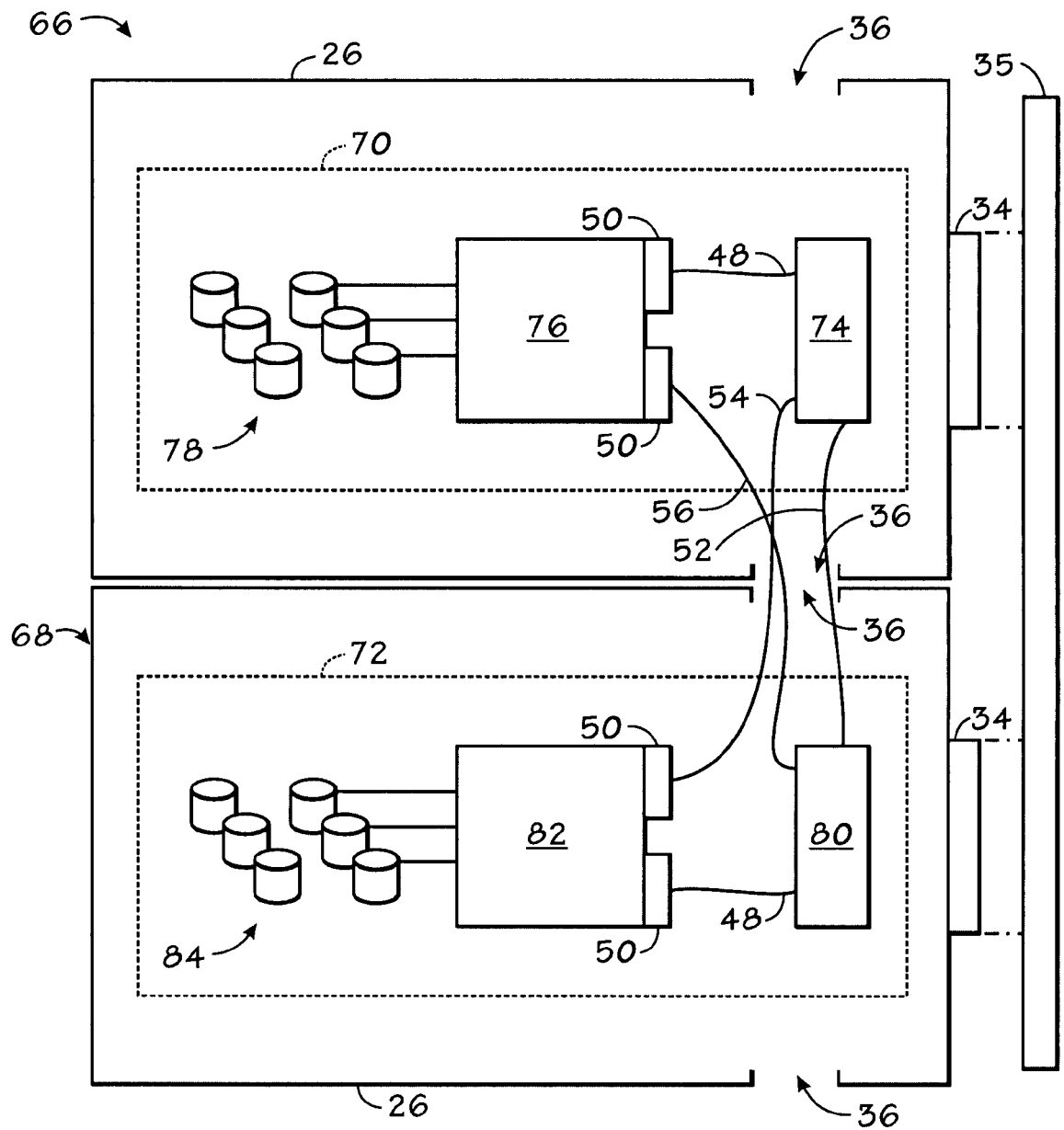
FIG. 5 is an illustration of the exemplary IO blades of FIG. 3 conjoined in accordance with aspects of the present technique.

Turning now to FIG. 5, two conjoined IO blade modules 66 and 68 are illustrated in a configuration similar to IO blade modules 24, described above with reference to FIG. 3, and processing modules 58 and 60, described above with reference to FIG. 4. In one embodiment two half height IO blade modules 66 and 68 are mechanically coupled such that one is positioned above the other and the channels 36 of the two IO blade modules 66 and 68 are aligned. For example, as depicted, the first IO blade module 66 comprising first IO devices 70 may be positioned above the second IO blade module 68 comprising second IO devices 72. Again, it is noted that "above" refers to positioning of the system 10 in a vertical configuration, however, the orientation may be varied. For example, the system 10 may be oriented such that the modules 66 and 68 are located horizontally to the side of one another. The lower channel 36 on the first IO blade module 66 is aligned with the upper channel 36 of the second IO blade module 68. The aligned channels 36 enable routing of cables 52, 54 and 56 between the first IO devices 70 and the second IO devices 72. For example, cables 52, 54 and 56 are connected to the first IO devices 70 and routed out of the enclosure 26 via one of the channels 36 to the second IO devices 72. Further, the modules 66 and 68 may be via the backplane connectors 34 and to the backplane 35.

The IO devices 70 and 72 may include numerous configurations of IO components, such as storage drives. As depicted in FIG. 5, the first IO devices 70 include a first disk controller 74, a first IO expander 76 and first disk drives 78. The second IO devices 72 include a second disk controller 80, a second IO expander 82 and second disk drives 84.

In one embodiment, the IO devices 70 and 72 may be electrically coupled. For example, the first disk controller 74 and the second disk controller 80 may be electrically coupled via the cable 52 passing through the aligned channels 36. Thus, the first disk controller 74 and the second disk controller 80 may be in communication and coordinate storage functions.

In another embodiment, each of the disk controllers 74 and 80 are electrically coupled to each of the expanders 76 and 82. For example, as depicted in FIG. 5, the cable 54 couples the first disk controller 74 to the second expander 82. The cable 54 is connected to the second expander 82 via an expander connector 50. In another embodiment, the cable 54 may be connected directly to the second expander 82 or connected to the second expander 82 via other IO components. Similarly, the cable 56 electrically couples the second disk controller 80 to the first expander 76. The cable 56 is connected to the first expander 82 via an expander connector 50. In another embodiment, the cable 56 may be connected directly to the first expander 76 or connected to the first expander 76 via other IO components. It should be noted that the first disk controller 74 and the second disk controller 80 are also electrically coupled to the second expander 82 and the first expander 76, respectively, via cables 48.

The electrical connectivity between each of the components of the IO blade modules 66 and 68 may enable a more robust and flexible system. In one embodiment, each of the controllers 74 and 80 may have independent access to the disk drives 78 and 84. For example, in an active/active embodiment, the first disk controller 74 and the second disk controller 80 may operate independently and interface the first disk drives 78 and the second disk drives 84 via the first expander 76 and the second expander 82, respectively. It should be noted that in this configuration, an embodiment may include one disk controller taking over control upon failure of the other disk controller. For example, upon failure of the first disk controller 74, the second disk controller 80 may continue to operate and control the functions previously accomplished by the first controller 74.

In an active/passive embodiment, only one disk controller is active and interfacing to all the disk drives 78 and 84 in the IO blade modules 66 and 68. A passive controller may monitor and mirror the state of the active controller. Upon failure of the active controller, the standby controller takes over and interfaces to all of the disk drives 78 and 84. For example, the first disk controller 74 may be an active controller configured to interact with the disk drives 78 and 84. The second disk controller 80 may monitor the state of the first disk controller 74 via the cable 52 and mirror the state of the first disk controller 74. Upon failure of the first disk controller 74, the second disk controller 80 may take over control of the disk drives 78 and 84. Thus, such an embodiment may provide for a more robust and flexible system 10 with fail-safe redundancy.

In another embodiment, only one of the controllers 74 and 80 may be present. For example, if only the first disk controller 74 is present, the disk controller 74 may control the devices of both IO modules 66 and 68. Such a system provides for a more economical deployment, as only one controller is provided to control multiple IO blade modules 66 and 68.

It should be noted that the embodiment of FIG. 5 enables varying the position of the IO blade modules 66 and 68. For example, in one embodiment, the first IO blade module 66 may be located below the second IO blade module 68. This is facilitated by the symmetrical design of the two IO blade modules 66 and 68. As depicted, the IO blade modules 66 and 68 contain similar components (such as IO devices 70 and 72) and similar enclosures 26 that contain multiple channels 36 located on both sides of each enclosure 26. The channels 36 enable routing of cables 52, 54 and 56 through the top or bottom of each enclosure 26, depending on the relative location of the IO blade modules 66 and 68. Thus, the IO blade modules 66 and 68 are symmetrical and may be exchanged in position without altering the overall functionality of the system 10.

Figure 6:
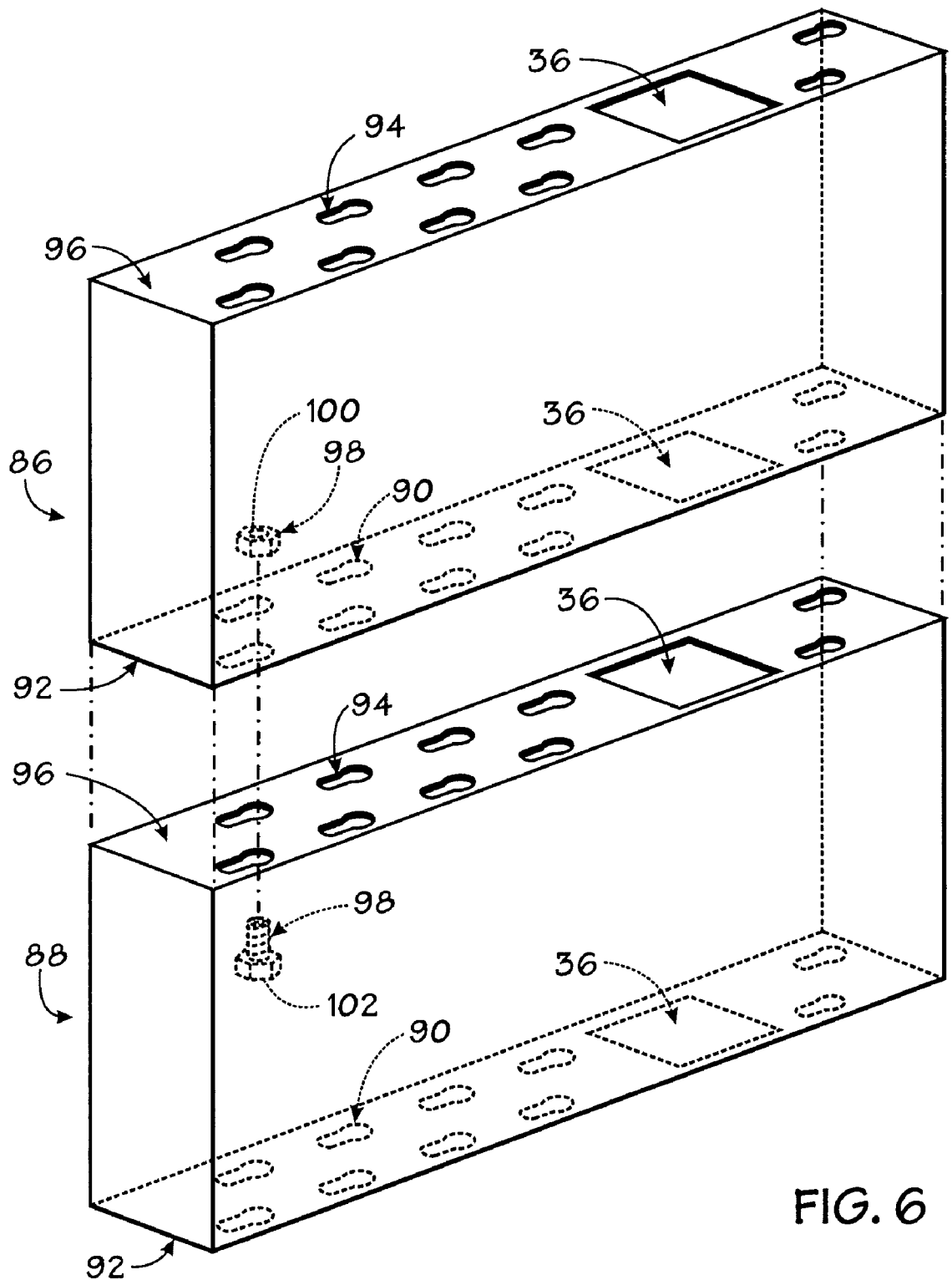
FIG. 6 is an exploded view of an embodiment of conjoined blade modules in accordance with aspects of the present technique.

As discussed briefly above, the enclosures 26 may enable mechanical coupling of multiple blade modules with aligned channels 36. Turning now to FIG. 6, an exploded view of a conjoined first blade enclosure 86 and a second blade enclosure 88 is illustrated. In one embodiment, the enclosures 86 and 88 include a set of coupling features configured to mechanically couple the blade enclosures 86 and 88. For example, as depicted in FIG. 6 the coupling features include a set of first alignment holes 90 located on the bottom face 92 of each enclosure 86 and 88 and a set of second alignment holes 94 located on the top face 96 of each enclosure 86 and 88. As depicted, in one embodiment the first alignment holes 90 and second alignment holes 94 are arranged such that they are complementary to each other. For example, when the bottom face 92 of the first blade enclosure 86 is proximate to the top face 96 of the second blade enclosure 88, the set of first alignment holes 90 are aligned with the set of second alignment holes 94. Thus, a coupling device 98 (such as a nut 100 and a bolt 102) may be inserted through each respective first and second alignment hole 90 and 94 to mechanically couple the enclosures 86 and 88. Embodiments may also include a shim located between the bottom face 92 of the first blade enclosure 86 and the top face 96 of the second blade enclosure 88. Such a shim may provide for varying of the overall height of the conjoined blade enclosures 86 and 88 as may be required by configurations. For example, if the overall height is less than that required by a full height blade bay, a shim may be added to provide the desired overall height of the conjoined blade enclosures 86 and 88.

The mechanical coupling of the two enclosures 86 and 88 may also enable alignment of the channels 36, in one embodiment. For example, as depicted, the alignment of the first blade enclosure 86 and the second blade enclosure 88 via a coupling feature (such as the alignment holes 90 and 94) also aligns the channels 36 of the two enclosures 86 and 88. Thus, the mechanically coupled enclosures 86 and 88 enable routing of cables 38, 52, 54 and 56 from the interior of the first blade enclosure 86 to the interior of second blade enclosure 88.

Figure 7:
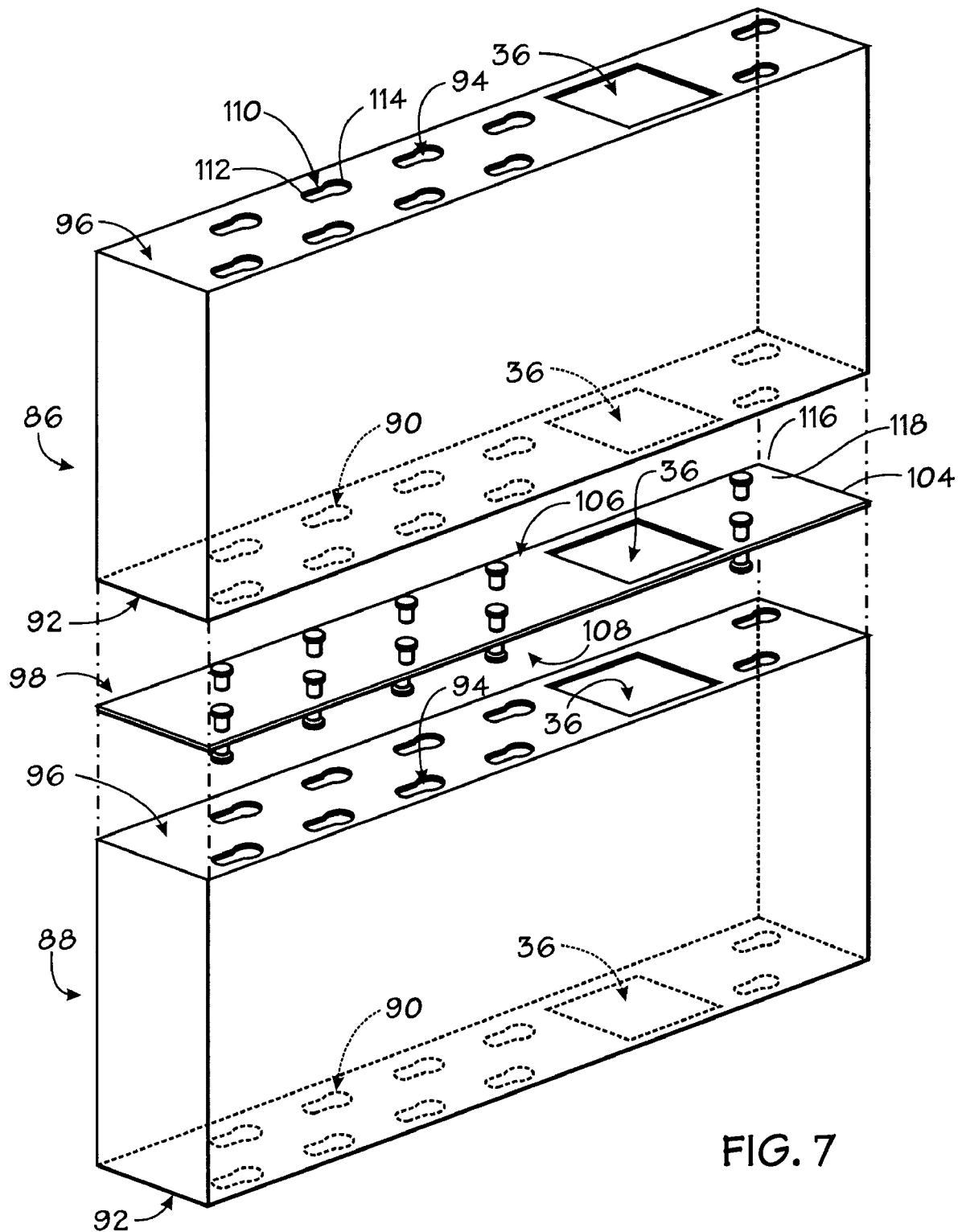
FIG. 7 is an exploded view of an alternate embodiment of conjoined blade modules in accordance with aspects of the present technique.

In another embodiment, the coupling device 98 includes an independent mechanism to couple the enclosures 86 and 88. For example, as depicted in FIG. 7, the coupling device 98 includes a plate 104, a set of first studs 106 and a set of second studs 108. The first set of studs 106 are arranged to align with the first alignment holes 90 located on the bottom face 92 of the enclosures 86 and 88. The set of second studs 108 are arranged to align with the second alignment holes 94 located on the top face 96 of the enclosures 86 and 88. Thus, to mechanically couple the first blade enclosure 86 to the second blade enclosure 88, the first set of studs 106 are mated to the first alignment holes 90 and the second set of studs are mated to the second alignment holes 94. The first and second set of studs 106 and 108 may be arranged in a similar fashion to enable either set of studs 106 and 108 to be mated with alignment holes 90 and 94 that have similar patterns. Thus, the coupling device 98 may be flipped and mated to either set of alignment holes 90 and 94. This may simplify the mechanism and process for mechanically coupling the two enclosures 86 and 88.

Further, the alignment holes 90 and 94 may take a variety of shapes and configurations. In one embodiment, as depicted in FIG. 7, the alignment holes 90 and 94 may include a cutout 110 comprising a slot 112 and a circular region 114. Thus, a head 116 of the studs 106 and 108 is inserted into the circular region 114 and a neck 118 of the studs 106 and 108 is slid into the slot 112 to mechanically couple the coupling device 98 to each of the enclosures 86 and 88. In this configuration, the channels 36 of the enclosures are aligned to enable routing of cables 38, 52, 54 and 56 from the interior of the first blade enclosure 86 to the interior of second blade enclosure 88.

As will be appreciated, the enclosures 86 and 88 may be coupled in a variety of manners to enable mechanical coupling and alignment of the channels 36. For example, each of the enclosures 86 and 88 may include a channel along the bottom faces 92 and a complementary rib along the top faces 96. The channel and the rib may be mated to conjoin the two enclosures 86 and 88.

It is also noted that as depicted in FIGS. 6 and 7, the conjoined half height blade enclosures 86 and 88 may be configured for use in a single blade bay. For example, the overall height of the enclosures 86 and 88, including any coupling device 98 and/or shim, has the same dimensions of a full height blade server 17. Thus, a more compact and robust system 10 may be implemented.

What is claimed is:

1. A blade system comprising:
   a first blade module comprising a first conjoining channel; and
   a second blade module comprising a second conjoining channel aligned with the first conjoining channel, wherein the first blade module and the second blade module are symmetrical and mechanically coupled to form a conjoined blade,
   wherein electrical components of the first blade module and electrical components of the second blade module are electrically coupled via an electrical coupler routed through the aligned first conjoining channel and second conjoining channel, and
   the first blade module and second blade module configured to operate in either an active/active mode and an active/passive mode, wherein during active/passive mode the first blade module and the second blade module operate independently with the first blade module remaining active while the second blade module is passive and monitors a status of the first blade module, the second blade module taking-over operations upon failure of the first blade module.

2. The blade system of claim 1, wherein the electrical coupler comprises a routing cable or a PCB bridge.

3. The blade system of claim 1, wherein the first blade module and the second blade module each comprise comprising a blade height that is about half of the height of a blade bay configured to receive the first blade module and the second blade module.

4. The blade system of claim 1, wherein the conjoined blade is configured for use in a single full-height server blade bay.

5. The blade system of claim 4, wherein the server blade bay is configured to accept the width of the conjoined blade.

6. The blade system of claim 1, wherein the first blade module and second blade module comprise processing blade modules.

7. The blade system of claim 1, wherein the first blade module and second blade module comprise IO blade modules.

8. The blade system of claim 1, wherein the first blade module and the second blade module each comprise an enclosure comprising the first conjoining channel on a first face of the enclosure and the second conjoining channel on a second face of the enclosure.

9. The blade system of claim 1, comprising a conjoining feature configured to mechanically couple the first blade module and the second server blade module.

10. The blade system of claim 1, comprising a conjoining device configured to mechanically couple the first blade module and the second blade module, and comprising a third conjoining channel aligned with the first conjoining channel and the second conjoining channel.

11. A blade system comprising:
a first blade module having an enclosure comprising a first conjoining channel, the enclosure configured to be mechanically coupled to a second blade module enclosure that comprises a second conjoining channel, the first conjoining channel configured to align with the second conjoining channel to provide a route to electrically couple electrical components contained in the first blade module to electrical components contained in the second blade module; the first blade module and second blade module configured for robust operations in either of an active/active mode and an active/passive mode;
wherein during active/passive mode the first blade module and the second blade module operate independently with the first blade module remaining active while the second blade module is passive and monitors a status of the first blade module, the second blade module taking-over operations upon failure of the first blade module.

12. The blade system of claim 11, wherein the first conjoining channel is configured to provide a route for a cable to electrically couple the electrical the components contained in the first blade module to the electrical components contained in the second blade module.

13. The blade system of claim 11, wherein the first blade module enclosure and the second blade module enclosure each comprise half height server blade enclosures.

14. The blade system of claim 11, wherein the first blade module enclosure is configured to enclose a processing server blade module.

15. The blade system of claim 11, wherein the first blade module enclosure is configured to enclose an IO server blade module.

16. The blade system of claim 11, wherein the first blade module enclosure comprises a second conjoining channel.

17. The blade system of claim 16, wherein the first conjoining channel is located in a first face of the first blade module enclosure, and wherein the second conjoining channel is located in a second face of the first blade module enclosure.

18. The blade system of claim 11, wherein the first blade module and the second blade module are symmetrical.

19. The blade system of claim 11, comprising coupling features configured to enable mechanically coupling the first blade module to the second blade module.

20. A conjoined blade system comprising:
a first blade module comprising a first blade module enclosure comprising a first set of holes and a first channel notch on at least one face of the enclosure;
a second blade module comprising a second blade module enclosure comprising a second set of holes and a second channel notch on at least one face of the second blade module enclosure, and wherein the first blade module and the second blade module are mechanically coupled via a conjoining attachment, wherein the conjoining attachment comprises:
a conjoining attachment body comprising a third channel notch, wherein the first channel, the second channel and third channel are aligned and configured to provide a path to electrically couple electrical components contained in the first module to electrical components contained in second module;
a first set of protrusions that are affixed to the conjoining attachment body and mated to the first set of holes; and
a second set of protrusions that are affixed to the opposite side of the conjoining attachment body and mated to the second set of holes; and
wherein configuration of the first blade module and second blade module operate flexibly in either of an active/active mode and an active/passive mode, during active/passive mode the first blade module and the second blade module operate independently with the first blade module remaining active while the second blade module is passive and monitors a status of the first blade module, the second blade module taking-over operations upon failure of the first blade module.

21. The conjoined blade system of claim 20, wherein the first set of holes and second set of holes comprise a circular cutout and a slotted cutout.

22. The conjoined blade system of claim 20, wherein the protrusions comprise studs comprising a head and a neck configured to mate with the first set of holes and the second set of holes.

23. The conjoined blade system of claim 20, wherein the first blade module comprises a third set of holes on a second face of the first blade module enclosure configured to mate with the second set of protrusions, and wherein the second blade module comprises a fourth set of holes on a second face of the second blade module enclosure configured to mate with the first set of protrusions.

* * * * *

UNITED STATES PATENT AND TRADEMARK OFFICE
CERTIFICATE OF CORRECTION

| | | |
|---|---|---|
| PATENT NO. | : 7,623,356 B2 | Page 1 of 1 |
| APPLICATION NO. | : 11/789601 | |
| DATED | : November 24, 2009 | |
| INVENTOR(S) | : Leigh et al. | |

It is certified that error appears in the above-identified patent and that said Letters Patent is hereby corrected as shown below:

In column 8, line 51, in Claim 3, after "each" delete "comprise".

In column 9, line 32, in Claim 12, after "electrical" delete "the".

Signed and Sealed this

Sixteenth Day of February, 2010

David J. Kappos
*Director of the United States Patent and Trademark Office*